United States Patent
Ochiai

[19]

[11] Patent Number: 5,831,425
[45] Date of Patent: Nov. 3, 1998

[54] BUS BAR STRUCTURE FOR ELECTRICAL JUNCTION BOX

[75] Inventor: Takehiko Ochiai, Shizuoka, Japan

[73] Assignee: Yazaki Corporation, Tokyo, Japan

[21] Appl. No.: 696,000

[22] Filed: Aug. 15, 1996

[30] Foreign Application Priority Data

Sep. 20, 1995 [JP] Japan .................................... 7-241897

[51] Int. Cl.⁶ .................................................. G01R 33/00
[52] U.S. Cl. ....................................................... 324/117 R
[58] Field of Search ........................... 324/117 R, 117 H, 324/126, 127

[56] References Cited

U.S. PATENT DOCUMENTS

| | | | |
|---|---|---|---|
| 3,372,334 | 3/1968 | Fenoglio et al. | 324/127 |
| 4,182,982 | 1/1980 | Wolf et al. | 324/127 |
| 4,492,919 | 1/1985 | Milkovic | 324/127 |
| 4,893,073 | 1/1990 | McDonald et al. | 324/117 H |
| 4,926,116 | 5/1990 | Talisa | 324/127 |
| 5,066,904 | 11/1991 | Bullock | 324/127 |
| 5,103,163 | 4/1992 | Mclyman | 324/117 H |
| 5,438,257 | 8/1995 | Berkcan | 324/117 H |
| 5,583,429 | 12/1996 | Otaka | 324/127 |
| 5,587,651 | 12/1996 | Berkcan et al. | 324/127 |
| 5,587,652 | 12/1996 | Berkcan et al. | 324/127 |

FOREIGN PATENT DOCUMENTS

64-42465  3/1989  Japan .............................. G01R 15/02

*Primary Examiner*—Josie Ballato
*Assistant Examiner*—Anh Phung
*Attorney, Agent, or Firm*—Sughrue, Mion, Zinn, Macpeak & Seas, PLLC

[57] ABSTRACT

A bus bar structure which can detect current exceeding the rated allowance of the current sensor and which does not involve insertion of the bus bar, thereby increasing the current sensor detection range, reducing the cost of manufacture due to downsizing of the magnetic core, improving the degree of freedom in the arrangement of the bus bar, and improving the operability of assembling the current sensor to the bus bar. The bus bar structure includes: an electrical junction box (21) to be mounted on a motor vehicle; a bus bar (37) arranged on the electrical junction box (21), the bus bar (37) serving as a bus bar from which to detect current; a current sensor (23) that is mounted on the electrical junction box (21); and a shunt bus bar (31) that is integrally formed with the current sensor (23) while passing through a magnetic core of the current sensor (23). In such a bus bar structure, both ends of the shunt bus bar (31) projecting from the current sensor 23 are connected in parallel to the current detection bus bar (37).

11 Claims, 7 Drawing Sheets

BUS BAR STRUCTURE FOR ELECTRICAL JUNCTION BOX

BACKGROUND OF THE INVENTION

1. Field of The Invention

The invention relates to a bus bar structure for an electrical junction box designed to be mounted on a motor vehicle. More specifically, the invention is directed to a structure for inserting a bus bar into a current detection device that is to be mounted on an electrical junction box.

2. Related Art

Figure 11:
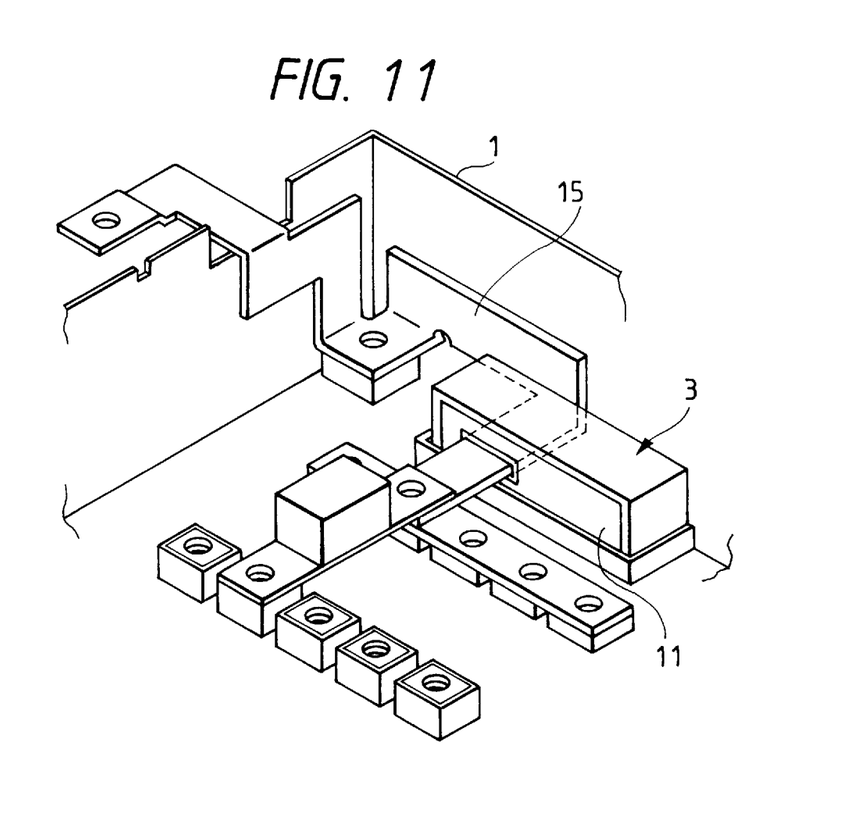
FIG. 11 is a perspective view showing a conventional bus bar structure.
Figure 12:
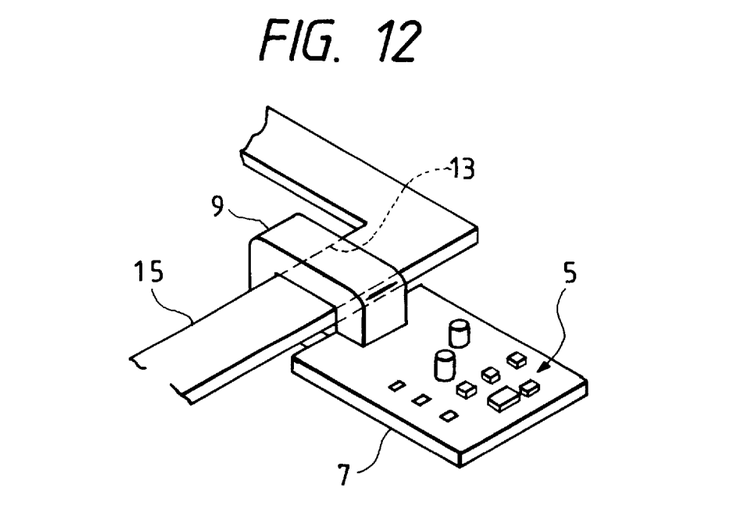
FIG. 12 is an enlarged main view showing a condition in which a bus bar is inserted into a current sensor.

A current detecting device (current sensor) may, in some cases, be attached to an electrical junction box mounted on a motor vehicle. FIG. 11 is a perspective view showing a conventional bus bar structure for an electrical junction box; and FIG. 12 is an enlarged diagram showing a main portion where the bus bar is inserted into a current sensor. As shown in FIG. 11, a current sensor 3 is mounted on the bottom of an electrical junction box 1. The current sensor 3 is constructed so that a board 7 having electronic parts 5 mounted thereon and a magnetic core 9 fixed to the board 7 are integrally formed with a mold resin 11 and are embedded therein. As shown in FIG. 12, a bus bar insertion space 13 is formed in the magnetic core 9. The bus bar insertion space 13 is open at both side surfaces of the current sensor 3. Therefore, a bus bar 15 is inserted into the bus bar insertion space 13 of the magnetic core 9 as shown.

This magnetic core 9 has a specific rating which corresponds to the current flowing through the bus bar 15 from which the current is detected. Bus bar 15 is referred to as the "current detection bus bar 15". With such a bus bar structure, a magnetic field generated by the current flowing through the bus bar 15 is concentrated on the magnetic core 9, and the intensity of the magnetic field is detected as a voltage using a galvanomagnetic element such as a Hall element. In this manner, the current flowing through the bus bar 15 is detected.

However, as noted above, in the aforementioned bus bar structure for an electrical junction box, the current sensor 3 has a specific rating which is designed to match the current flowing through the current detection bus bar 15. Therefore, when a current exceeding the specific rating flows through the bus bar 15 due to a change in the specification of the electrical junction box 1, a new current sensor having a rating that matches such current must be mounted.

In this case, the width of the current detection bus bar must be increased, which in turn necessarily increases the size of the magnetic core 9 within the current sensor 3 and hence increases the size of the current sensor as a whole.

Further, the aforementioned bus bar structure is designed so that the bus bar 15 is inserted into the current sensor 3. Therefore, an additional operation of inserting the bus bar 15 must be performed. As a result, the operability of assembling the electrical junction box is reduced.

Still further, the specific structure associated with the insertion of the bus bar 15 must be compatible with the mounting positions of both the current sensor 3 and the bus bar 15. Therefore, there is a limited degree of freedom in designing the bus bar arrangement.

The invention has been made in view of the aforementioned circumstances. The object of the invention is therefore to provide a bus bar structure which can detect a current exceeding the rated allowance of the current sensor and which does not involve insertion of the bus bar, thereby increasing the current sensor detection range, reducing the cost of manufacture due to the downsizing of the magnetic core, improving the degree of freedom in bus bar design, and improving the operability of assembling the current sensor to the bus bar.

SUMMARY OF THE INVENTION

To achieve the above object, the invention is applied to a bus bar structure for an electrical junction box, which includes: an electrical junction box to be mounted on a motor vehicle; a current detection bus bar arranged on the electrical junction box; a current sensor attached to the electrical junction box; and a shunt bus bar integrated with the current sensor and passing through a magnetic core of the current sensor. With such a bus bar structure, both ends of the shunt bus bar projecting from the current sensor are connected in parallel to the current detection bus bar.

The thus constructed bus bar structure for an electrical junction box is characterized in that the shunt bus bar integrated with the current sensor is assembled to the electrical junction box so that it is connected in parallel to the bus bar and that the quantity of current flowing through the shunt bus bar of the current sensor can be controlled by simply adjusting the width of the bus bar connected in parallel to the shunt bus bar. As a result, the current sensor can be used in various ranges.

Bus bar structures for electrical junction boxes, which are the preferred embodiments of the invention, will now be described in detail with reference to the drawings.

DETAILED DESCRIPTION OF THE INVENTION

Figure 1:
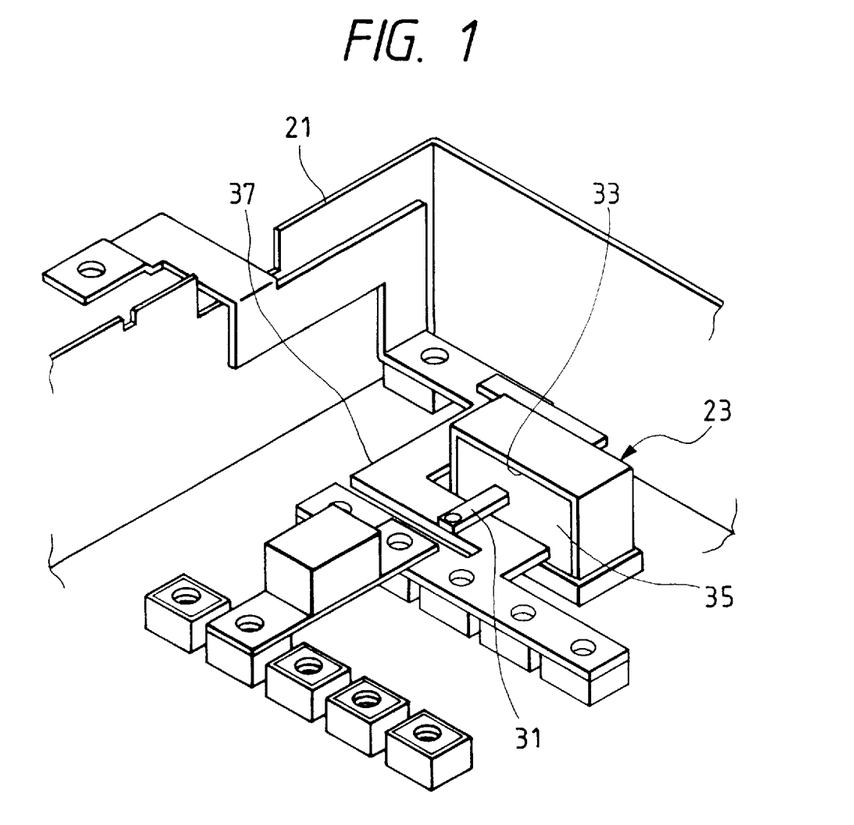
FIG. 1 is a perspective view showing a bus bar structure, which is a first embodiment of the invention.
Figure 2:
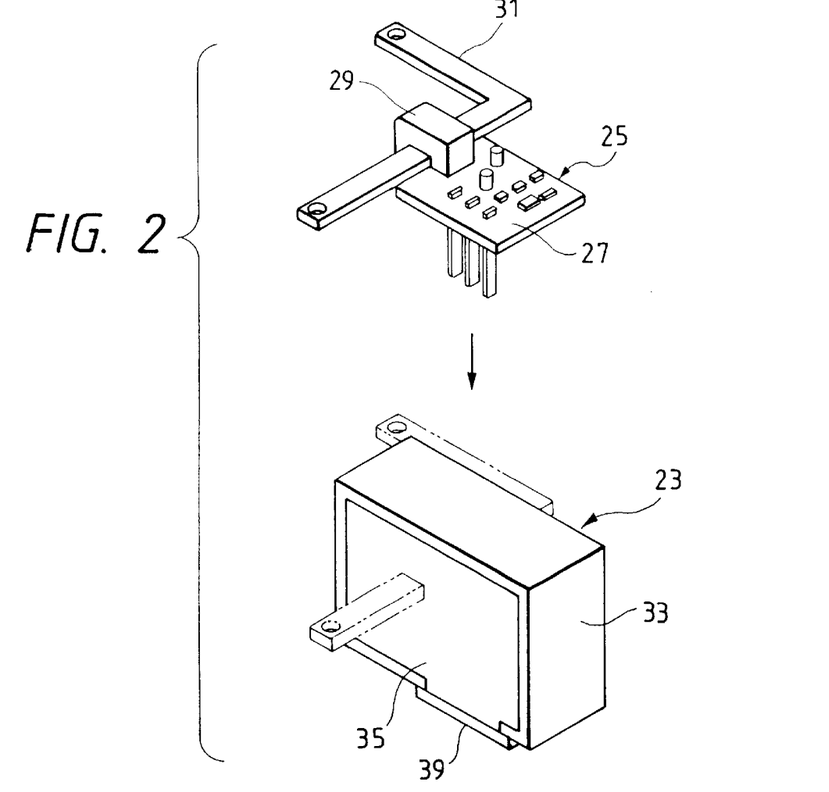
FIG. 2 is an exploded perspective view showing the configuration of a current sensor shown in FIG. 1.
Figure 3:
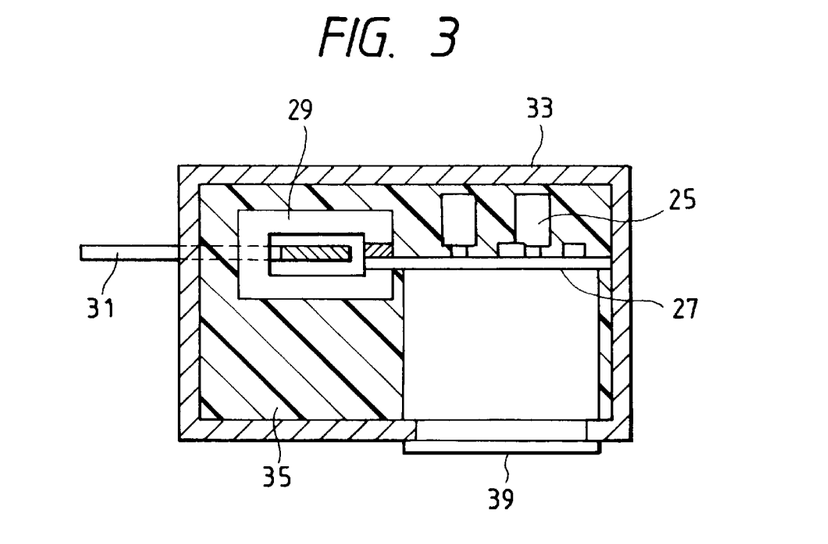
FIG. 3 is a sectional view of the current sensor shown in FIG. 1.
Figure 4:
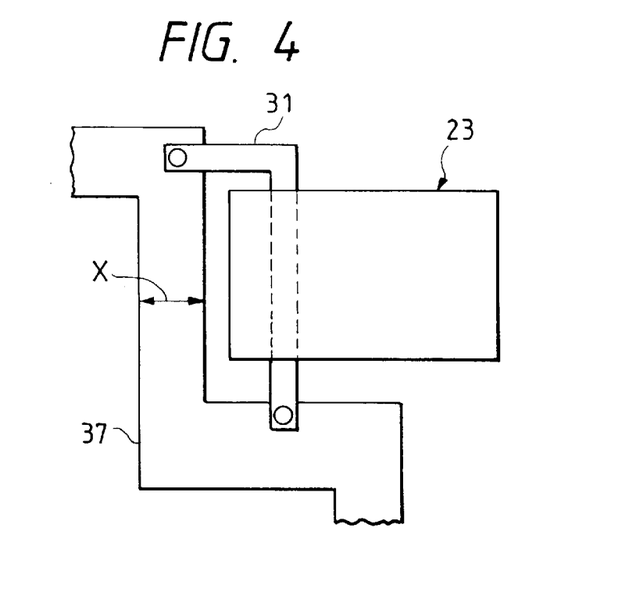
FIG. 4 is a plan view showing a main portion of the bus bar structure shown in FIG. 1.

FIG. 1 is a perspective view showing a bus bar structure, which is a first embodiment of the invention; FIG. 2 is an exploded perspective view showing the configuration of a current sensor shown in FIG. 1; FIG. 3 is a sectional view of the current sensor shown in FIG. 1; and FIG. 4 is a plan view showing a main portion of the bus bar structure shown in FIG. 1.

A current sensor 23 is mounted on the bottom of an electrical junction box 21. The current sensor 23 includes a board 27 having electronic components 25 mounted thereon, a magnetic core 29 that is fixed to the board 27 and a shunt bus bar 31 that is inserted into a bus bar insertion space of the magnetic core 29.

The current sensor 23 accommodates the board 27, the magnetic core 29, and the shunt bus bar 31 in a case 33, and all of these parts are integrally molded into a single body by a mold resin 35 injected into the case 33 with these parts embedded therein. Therefore, the shunt bus bar 31 that is inserted into the embedded magnetic core 29 projects from both side surfaces of the current sensor 23. The shunt bus bar 31 is, e.g., L-shaped as viewed from top.

A bus bar 37, from which current is detected (hereinafter referred to as the "current detection bus bar" whenever applicable) is arranged on the bottom of the electrical junction box 21 to which the current sensor 23 is attached. This bus bar 37 has, e.g., an L-shaped portion on a horizontal plane. Both ends of the shunt bus bar 31 projecting from the current sensor 23 are connected to ends of the L-shaped portion of the bus bar 37 by screws or the like, respectively. As a result, the shunt bus bar 31 is connected in parallel to the bus bar 37.

Since the shunt bus bar 31 is connected in parallel to the bus bar 37, the width of the shunt bus bar 31 may be relatively narrow. Therefore, the magnetic core 29 within the current sensor 23 for current detection can be corresondingly small.

This bus bar structure is assembled in the following way. After the bus bar 37 has been arranged on the bottom of the electrical junction box 21, the current sensor 23 having the shunt bus bar 31 projected therefrom is mounted onto the bottom of the electrical junction box 21, and at the same time, the shunt bus bar 31 is connected to the bus bar 37. When the current sensor 23 is mounted on the bottom of the electrical junction box 21, an engagement surface of a connector 39 of the current sensor 23 arranged on the lower surface of the case 33 is exposed from the bottom opening of the electrical junction box 21.

The thus constructed bus bar structure is characterized in that the shunt bus bar 31 integrated with the current sensor 23 is assembled to the electrical junction box 21 so that it is connected in parallel to the bus bar 37 as shown in FIG. 4. Therefore, the amount of current flowing through the shunt bus bar 31 of the current sensor 23 is controlled by adjusting the width X of the bus bar 37 connected in parallel to the shunt bus bar 31. As a result, the current sensor 23 can be applied to various ranges (current detection ranges). Specifically, even if current flowing through the bus bar 37 is increased due, e.g., to a change in the specification of the electrical junction box 21, there is no need to mount a new current sensor 23 having an increased rating.

Further, since current can be detected at the shunt bus bar 31 through which a current smaller than that of the current detection bus bar 37 flows, the size of the magnetic core 29 can be reduced. As a result, the current sensor 23 can be downsized, and the cost of manufacture can also be reduced.

Still further, according to the aforementioned bus bar structure, the shunt bus bar 31 can be assembled to the bus bar 37 by simply connecting them in parallel to each other. Therefore, the current detection bus bar 37 is no longer inserted into the current sensor 23, which in turn contributes to improving the degree of freedom in the arrangement of the bus bar 37.

The shunt bus bar 31 is integrally formed with the current sensor 23, so that the conventionally required assembling operation in which the current detection bus bar 37 is inserted into the current sensor 23 can be dispensed with. Therefore, the current sensor 23 assembly can be improved significantly.

Figure 5:
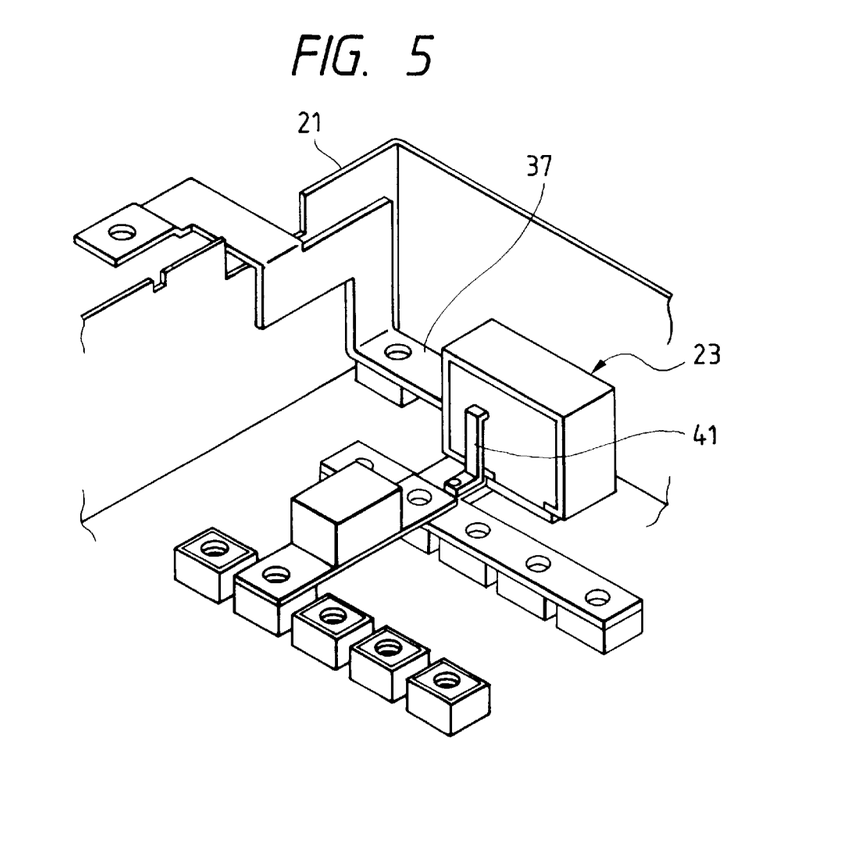
FIG. 5 is a perspective view showing a bus bar structure, which is a second embodiment of the invention.
Figure 6:
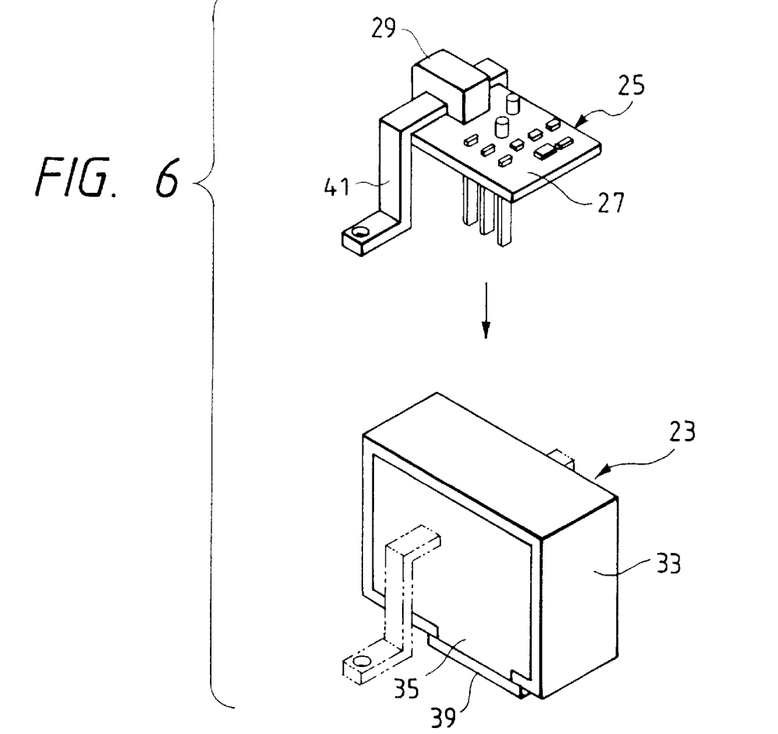
FIG. 6 is an exploded perspective view showing the configuration of a current sensor shown in FIG. 5.

A bus bar structure which is a second embodiment of the invention will be described with reference to FIGS. 5 and 6. FIG. 5 is a perspective view showing the bus bar structure and FIG. 6 is an exploded perspective view showing the current sensor.

The second embodiment is the same as the first embodiment in that a shunt bus bar 41 is integrally formed with the current sensor 23. The second embodiment differs in regard to the configuration of the shunt bus bar 41. Specifically, the shunt bus bar 41 is configured so that the opposite ends projecting from the current sensor 23 extend downwardly, with the central portion horizontally passing through the current sensor 23. Such downwardly bent ends of the shunt bus bar 41 can be connected and fixed to the upper surface of the current detection bus bar 37 arranged on a horizontal plane with the current sensor 23 mounted on the bottom of the electrical junction box 21 (see FIG. 5).

That is, whereas the shunt bus bar 31 in the first embodiment is coplanar with the current detection bus bar 37, the shunt bus bar 41 in the second embodiment is not. According to the thus constructed bus bar structure, the shunt bus bar 41 can be connected cubically. Therefore, the internal space of the electrical junction box 21 can be utilized effectively, which in turn allows the bus bar arrangement area in the electrical junction box 21 to be reduced.

Figure 7:
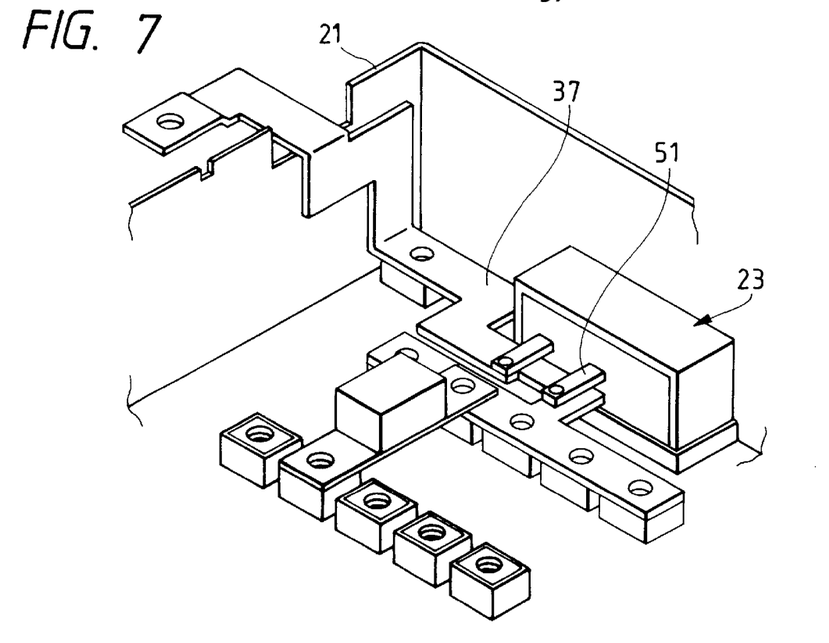
FIG. 7 is a perspective view showing a bus bar structure, which is a third embodiment of the invention.
Figure 8:
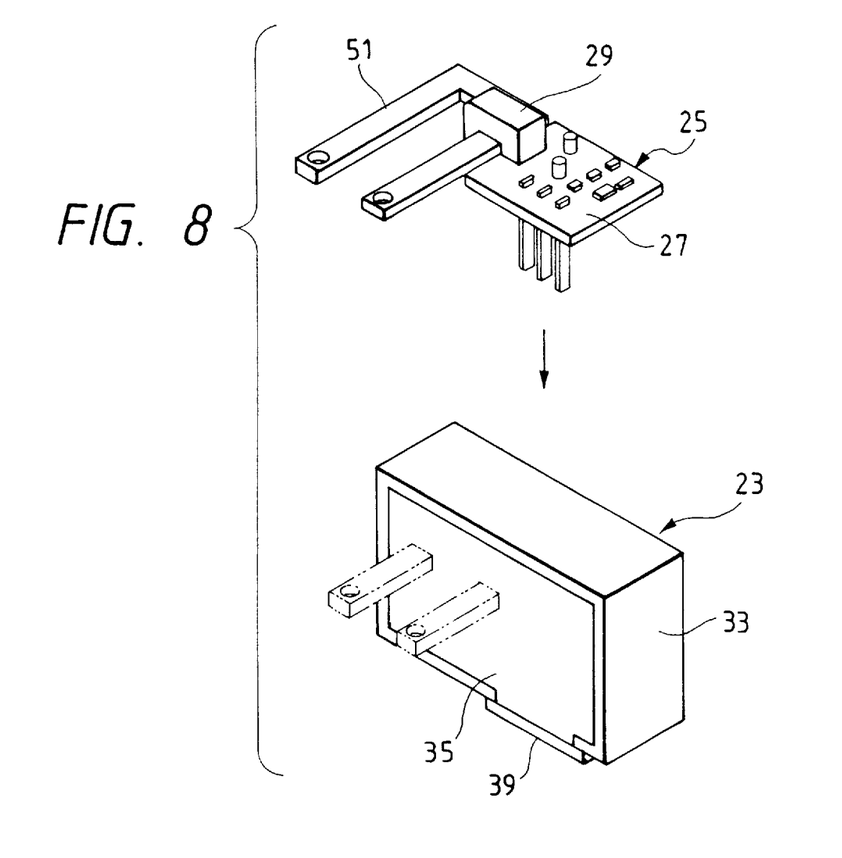
FIG. 8 is an exploded perspective view showing the configuration of a current sensor shown in FIG. 7.

A bus bar structure according to the third embodiment of the invention, will be described with reference to FIGS. 7 and 8. FIG. 7 is a perspective view showing the bus bar structure and FIG. 8 is an exploded perspective view showing the current sensor. In the bus bar structure according to this embodiment, a shunt bus bar 51 to be inserted into the magnetic core 29 of the current sensor 23 is formed so as to be U-shaped and disposed on a horizontal plane. The base portion of the shunt bus bar 51 is inserted into a bus bar insertion space of the magnetic core 29.

This current sensor 23 is also designed so that the shunt bus bar 51 is integrally formed by a mold resin 35 while embedded in the current sensor 23. Therefore, the shunt bus bar 51 inserted into the magnetic core 29 has both ends thereof projected from one side surface of the current sensor 23.

When the thus constructed current sensor 23 is mounted on the electrical junction box 21, the parallel projecting ends of the shunt bus bar 51 are connected and fixed to a linear portion of the current detection bus bar 37. As a result, the U-shaped portion of the shunt bus bar 51 is connected in parallel to the current detection bus bar 37.

This bus bar structure is characterized by the fact that the shunt bus bar 51 has a U-shaped body. Therefore, both ends of the shunt bus bar 51 are allowed to project from one side surface of the current sensor 23. This allows the shunt bus bar 51 to be connected to the current detection bus bar 37 as long as the current detection bus bar 37 has a linear portion to which the ends of the shunt bus bar 51 can be connected.

Further, since the shunt bus bar 51 projects only from one side surface of the current sensor 23, the current sensor 23 can be mounted in such a manner that the surface of the current sensor 23 opposite to the surface thereof from which the shunt bus bar 51 projects is relatively close to the inner wall of the electrical junction box 21. Therefore, the current sensor 23 can be mounted in a compact manner.

Figure 9:
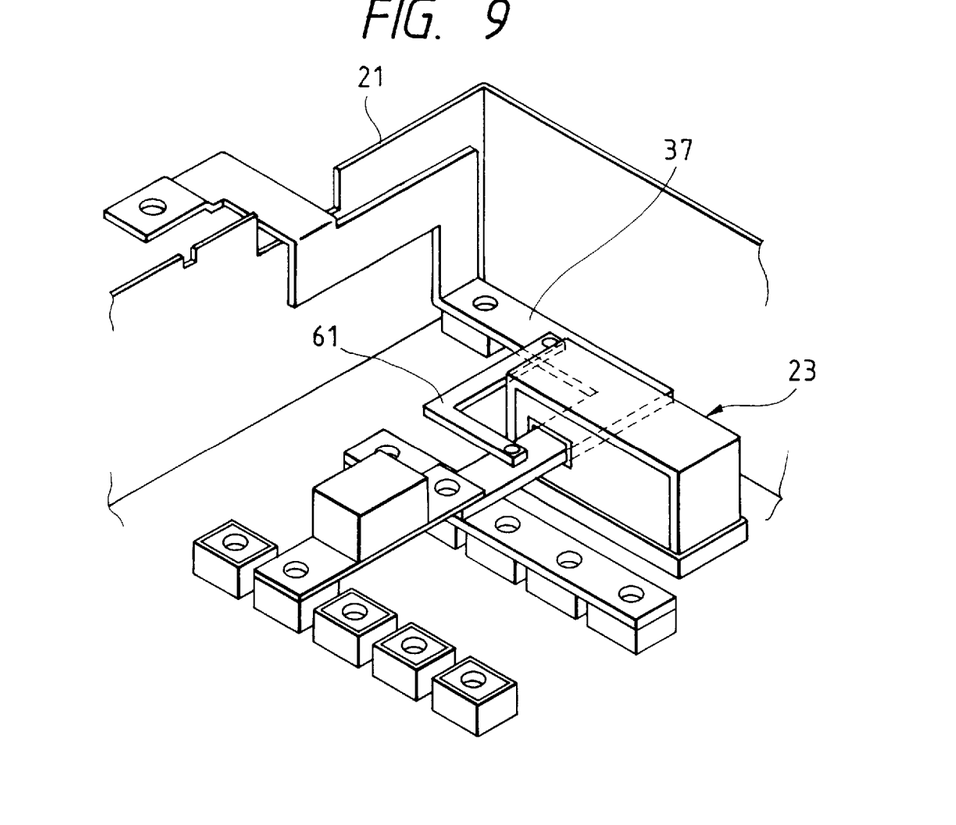
FIG. 9 is a perspective view showing a bus bar structure, which is a fourth embodiment of the invention.
Figure 10:
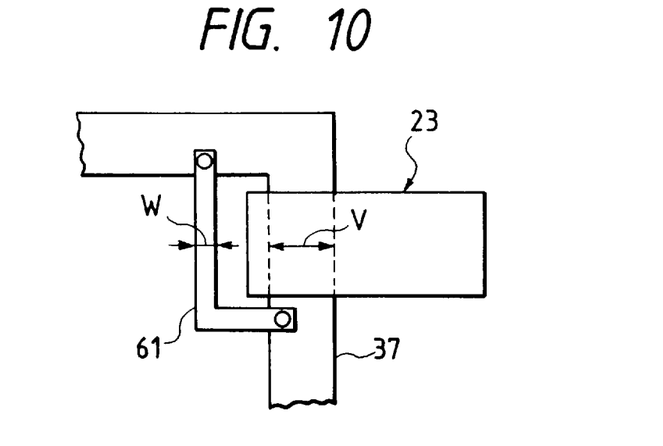
FIG. 10 is a plan view showing a main portion of the bus bar structure shown in FIG. 9.

Finally, a bus bar structure, which is a fourth embodiment of the invention, will be described with reference to FIGS.

9 and 10. FIG. 9 is a perspective view showing the bus bar structure and FIG. 10 is a plan view showing the main portion of the bus bar structure shown in FIG. 9.

This bus bar structure is characterized by arranging an inverted L-shaped current detection bus bar 37 on the electrical junction box 21. An end of the bus bar 37 is inserted into the current sensor 23 that is mounted on the bottom of the electrical junction box 21. This bus bar 37 has a shunt bus bar 61, which is, e.g., L-shaped, connected in parallel to both end portions thereof that have passed through and are projected from the current sensor 23.

The procedure for assembling this bus bar structure involves the following steps: connecting the shunt bus bar 61 in parallel to the bus bar 37 after the bus bar 37 has been inserted into the current sensor 23; and assembling the bus bar 37, the current sensor 23, and the shunt bus bar 61 that have been integrated with one another to the current junction box 21.

When the current flowing through the bus bar 37 exceeds an allowable detection range of the current sensor 23, this shunt bus bar 61 causes the exceeding current portion to shunt, so that such a current as to match the rating of the current sensor 23 is allowed to flow through the bus bar 37 that is on the side of the current sensor 23.

Therefore, as shown in FIG. 10, when the current flowing through the bus bar 37 having a width V exceeds a detection range allowed by the current sensor 23, an excessive current portion is shunted by connecting the shunt bus bar 61 in parallel to the bus bar 37. As a result, such a current as to match the rating of the current sensor 23 is allowed to flow through the current sensor 23. At this moment, if the width W of the shunt bus bar 61 is adjusted, such a current as to match the rating of the current sensor 23 is allowed to flow through the current detection bus bar 37.

This bus bar structure is characterized as allowing the quantity of current flowing through the current detection bus bar 37 to be controlled by adjusting the width W of the shunt bus bar 61. Therefore, the current sensor 23 that is used as a dedicated device is given a wider range of application. As a result, the current sensor 23 can be used for currents exceeding those in the allowable range thereof.

As described in the foregoing in detail, the bus bar structure for an electrical junction box of the invention is characterized as connecting the shunt bus bar integrated with the current sensor in parallel with the current detection bus bar. Therefore, by adjusting the width of the bus bar, the detection range of the current sensor can be increased. As a result, even if the current flowing through the bus bar is increased by, e.g., the specification of the electrical junction box having been changed, there is no need to mount a new current sensor that has such a rating as to match the increased current. Further, current detection can be effected by the shunt bus bar through which a current smaller than that of the current detection bus bar flows. Therefore, the magnetic core can be downsized, which in turn contributes to downsizing the current sensor and reducing the cost of manufacture. Still further, according to the aforementioned bus bar structure, the assembling can be completed only by connecting the shunt bus bar in parallel to the bus bar. Therefore, the degree of freedom in the arrangement of the bus bar is increased. In addition, since the shunt bus bar is integrated with the current sensor, the operation of assembling the bus bar to the current sensor is dispensed with, which in turn allows the operability in assembling the bus bar to the current sensor to be improved significantly.

What is claimed is:

1. A bus bar structure, comprising:
   an electrical junction box;
   a current detection bus bar location inside said electrical junction box; and
   a current sensor disposed inside said electrical junction box for detecting the current flowing through said current detection bus bar, said current sensor including:
   a case,
   a magnetic core in said case, a shunt bus bar integrated with the current sensor and passing through said magnetic core of said current sensor,
   wherein opposite ends of said shunt bus bar project from the current sensor and are removably and electrically connected to said current detection bus bar so as to be connected in parallel thereto.

2. The bus bar structure according to claim 1, wherein said current detection bus bar and said shunt bus bar are disposed in parallel planes.

3. The bus bar structure according to claim 2, wherein said parallel planes are horizontal.

4. The bus bar structure according to claim 3, wherein said shunt bus bar is L-shaped.

5. The bus bar structure according to claim 1, wherein said shunt bus bar includes a central portion and said opposite ends which are connected to said central portion.

6. The bus bar structure according to claim 5, wherein said opposite ends extend in a direction perpendicular to said central portion.

7. The bus bar structure for an electrical junction box according to claim 6, wherein shunt bus bar is substantially U-shaped.

8. The bus bar structure for an electrical junction box according to claim 7, wherein said shunt bus bar is disposed on a vertical plane.

9. The bus bar structure for an electrical junction box according to claim 7, wherein shunt bus bar is is disposed on a horizontal plane.

10. The bus bar structure according to claim 1, wherein said junction box is adapted to be mounted on a motor vehicle.

11. The bus bar structure according to claim 1, wherein said current sensor further includes a board having electronic components thereon for sensing said current, and a resin body injected inside said case for integrally retaining said magnetic core.

* * * * *